United States Patent [19]

Tropp

[11] Patent Number: 5,196,797
[45] Date of Patent: Mar. 23, 1993

[54] METHOD OF CORRECTING AN ASYMMETRY IN AN NMR RADIO FREQUENCY COIL AND AN IMPROVED RADIO FREQUENCY COIL HAVING N-FOLD SYMMETRY AND REDUCED EDDY CURRENT

[75] Inventor: James S. Tropp, Berkeley, Calif.

[73] Assignee: Toshiba America MRI, Inc., So. San Francisco, Calif.

[21] Appl. No.: 607,146

[22] Filed: Oct. 31, 1990

[51] Int. Cl.$^5$ .......................................... G01R 33/20
[52] U.S. Cl. ..................................... 324/322; 324/318
[58] Field of Search ............... 324/322, 318, 309, 313, 324/314; 333/219, 221; 128/653.5

[56] References Cited

U.S. PATENT DOCUMENTS

| | | | |
|---|---|---|---|
| 4,439,733 | 3/1984 | Hinshaw et al. | 324/322 |
| 4,638,253 | 1/1987 | Jaskolski et al. | 324/318 |
| 4,680,548 | 7/1987 | Edelstein et al. | 324/318 |
| 4,692,705 | 9/1987 | Hayes | 324/318 |
| 4,694,255 | 9/1987 | Hayes | 324/318 |
| 4,820,985 | 4/1989 | Eash | 324/318 |
| 4,833,409 | 5/1989 | Eash | 324/318 |
| 4,916,418 | 4/1990 | Rath | 324/322 |

FOREIGN PATENT DOCUMENTS

| | | | |
|---|---|---|---|
| 0093387 | 5/1990 | Japan | 324/318 |
| 8500138 | 8/1986 | Netherlands | 324/318 |

OTHER PUBLICATIONS

J. Magn. Reson., 63, pp. 622–628 (1985), "An Efficient, Highly Homogeneous RF Coil for Whole-Body NMR Imaging at 1.5 T", C. E. Hayes, W. A. Edelstein, J. F. Schenck, O. M. Mueller, M. Eash.
J. Magn. Reson., 82, pp. 51–62 (1989), "The Theory of the Bird–Cage Resonator", J. Tropp.
IEEE Trans. on Medical Imaging, vol. 8, No. 3, Sep. 1989, pp. 286–294, "A Technique for Double Resonant Operation of Birdcage Imaging Coils", P. M. Joseph, D. Lu.
Proc. of the Soc. of Magn. Reson. in Medicine, 8th Annual Meeting, Amsterdam, 1989, p. 945, "Theory and Implementation of the Quadrature Driven Low Pass Birdcage Resonator", D. A. C. Kelly, J. Murphy-Boesch, D. Vigneron, T. R. Brown.
Proc. of the Soc. of Magn. Reson. in Medicine, 9th Annual Meeting, New York, 1990, p. 506, "The Loss of Signal to Noise in Quadrature Reception Due to Imperfect Isolation Between Channels: Comparison of Theory, Experiment, and Simulation", J. Tropp, D. Derby.
J. Mag. Reson., 86, pp. 488–495, 1990, "Design and Performance of a Double-Tuned Bird-Cage Coil", A. R. Rath.
Soc. of Magn. Reson. in Medicine, 7th Ann. Meeting, San Francisco, Aug. 22–26, 1988, "The Theory and Practice of the Driven Bird Cage Coil Neglecting the Effects of Broken Symmetry", J. Tropp.
Soc. of Magn. Reson. in Medicine, 8th Ann. Meeting, Amsterdam, Aug. 12–18, 1989, "The Theory of Imperfect, Quatrature-Tuned, Low Pass Bird Cage Resonator", J. Tropp.
Soc. of Magn. Reson. in Medicine, 7th Ann. Meeting, San Francisco, Aug. 22–26, 1988, "The Theory of Broken Symmetry in the Low Pass Bird Cage Resonator" J. Tropp.

Primary Examiner—Michael J. Tokar
Assistant Examiner—Raymond Y. Mah
Attorney, Agent, or Firm—Limbach & Limbach

[57] ABSTRACT

In the present invention a method is disclosed to correct the asymmetry in an NMR radio frequency coil of the type that has a pair of conductive loop elements disposed in a spaced apart relation along a common longitudinal axis. The coil has at least eight conductive elements electrically interconnecting the loop elements at point spaced along the periphery of each of the loops. A pair of corrective capacitive elements are placed 45° apart from one another and in series with a pair of the conductive segments which interconnect the loops. The present invention also relates to an NMR radio frequency coil having N-fold symmetry and reduced eddy current.

8 Claims, 1 Drawing Sheet

METHOD OF CORRECTING AN ASYMMETRY IN AN NMR RADIO FREQUENCY COIL AND AN IMPROVED RADIO FREQUENCY COIL HAVING N-FOLD SYMMETRY AND REDUCED EDDY CURRENT

TECHNICAL FIELD

The present invention relates to a method of correcting an asymmetry in an NMR radio frequency coil of the type that has a pair of conductive loop elements disposed in a spaced apart relation along a common longitudinal axis, with at least eight conductive elements electrically interconnecting loop elements at points spaced along the periphery of each of the loops. The present invention also relates to an NMR radio frequency coil having N-fold symmetry and reduced eddy current.

BACKGROUND OF THE INVENTION

NMR radio frequency coils are well known in the art. See, for example, U.S. Pat. Nos. 4,680,548; 4,692,705; 4,694,255; and 4,439,733.

NMR radiofrequency coils are used as transmitters and or receivers in NMR imaging and spectroscopy. The tuning of such coils to form electrical resonators, and the use of such resonators as antennae for transmission or reception is well known to those in the NMR art; as is the characterization, (by the principle of electromagnetic reciprocity) of the efficiency of such resonators by the strength and uniformity of radiofrequency field that they produce when energized electrically. Also well-known is the coupling of such resonators to transmission lines, by means of reactive impedance-matching networks, to allow the flow (unimpeded by electrical reflections) of electrical signals between said resonators and other components comprising the remainder of the transmission and reception circuitry of the NMR apparatus. Although separate meanings may be assigned to words "coil" and "resonator", it is common in the NMR art to use the two interchangeably; and we shall do likewise, and shall call special attention to any instance of using these terms in a more exclusive manner.

Although a common design goal for volume coils is the production of a uniform and linearly polarized oscillatory B field in the space bounded by the resonator, increased efficiency accrues in both transmission and reception if it is possible to produce instead a uniform and circularly polarized field within that space, with the polarization axis parallel to the cylinder axis, so that an azimuthally directed B field vector progresses about said axis. The practice of reception with such a coil is known in the art as quadrature detection (QD); and coils employing QD are known as quadrature coils; and by their use the power required for transmission may be reduced by one half, and the achievable signal to noise ratio in reception may be increased by the square root of two, relative to similar coils with linear fields.

One well known and simple embodiment of a quadrature coil consists of two identical volume coils, each capable of producing linearly polarized B fields, with the two mounted coaxially so that their linear polarization planes are orthogonal. Each of the two coils is provided with its own impedance matching circuitry, to allow communication with the rest of the NMR apparatus. Quadrature transmission is realized by exciting the two coils with radiofrequency signals of equal power but shifted in phase from each other by $\pi/2$. Quadrature reception is achieved by simultaneously receiving the NMR radiofrequency signals (induced by precessing nuclear magnetization) from each coil's signal and shifting the phase of one coil's signal by $\pi/2$ relative to that of the other, and then adding the shifted signals in a power combiner, from which they are sent for further processing. These functions of phase shifting and power combination are accomplished typically by a single device, known in the art as a quadrature hybrid.

Since separate signals are derived from (in reception) or applied to (in transmission) each of the two resonators comprising the QD resonator, we will speak of the two quadrature channels in reference to the aggregate circuitry comprising the respective signal paths. As is known in the art, it is important in this process that the signals from the two channels remain isolated from each other until the time at which they are added together.

An outstanding problem in the embodiment of QD described above is the maintenance electrical isolation between the two actual resonators, so that when each is matched to its own receiver line, one of the two may be selectively excited, or energized, without producing any signal in the receive channel served by the other. Failure of such isolation causes contamination of one channel's signal with the other's, which reduces the achievable improvement of signal to noise and thereby partly nullifies the advantage of QD. This contamination will be referred to as cross-talk.

A pair of coils comprising a QD resonator will be said to be well isolated, or to have good isolation, when the cross-talk is low, as determined by criteria to be discussed later. A pair coils having imperfect isolation (even in slight degree) will be said to be mutually coupled, or coupled. In the embodiment described above, the coupling arises from two major causes: the failure to produce exact mechanical alignment of the resonators so as to truly orthogonalize their respective B fields (i.e. coupling by mutual inductance); or the difficulty of avoiding stray E fields arising from one resonator impinging upon the other during operation (i.e. coupling by mutual capacitance.) In either case, the coupling effect may be described in circuit theoretic terms as being due to a mutual impedance between the two resonators.

As is well known in the radiofrequency and microwave arts, particularly as those arts pertain to the design and construction of electrical filters, a pair of identical electrical resonators coupled together will produce an electrical resonance spectrum comprising two separate frequencies. The strength of the coupling is related to the separation of the frequencies by a parameter called the coefficient of coupling, here denoted $\xi$, which may be defined as $\delta\omega/\omega_o$, where $\delta\omega$ is the separation of resonance frequencies and $\omega_o$ is the undisturbed frequency. It is also convenient to define a normalized coefficient of coupling by $\xi Q = \eta$ where Q is the common quality factor of the two resonators. The use of the normalized coefficient of coupling is known to those in the radiofrequency and microwave arts.

The standard measurement of cross talk proceeds by matching both probe channels to the characteristic impedance of the transmission line, and then injecting radiofrequency power into one probe channel, and measuring the power emitted from the other. The measurement is symmetric in both channels. The cross talk in dB is defined as 10 log (emitted power/injected power). It can be shown for a pair of coupled resonators with normalized coupling coefficient of $\eta$ that the cross talk in dB is accurately predicted by the formula $-20 \log \eta$, for values of $\eta$ ranging from zero up to at least 0.5. It can further be shown that the loss of signal noise (in dB) of a coupled quadrature system relative to that obtained in a perfectly isolated quadrature system is accurately predicted by $-10 \log(1+\eta^2)$. This last formula is subject to a condition that the impedance matching between probes, quadrature hybrids and receiver preamplifiers be near-perfect, and also to the above stated condition that $\eta$ not exceed roughly 0.5 in magnitude.

All embodiments of QD suffer the isolation difficulty, and whether the etiology of the problem is exactly as for the exemplary embodiment described above, is more a matter of language than of physics and engineering. The main subject of this patent is a method of producing isolation in a quadrature resonator different from that described above.

A type of resonator is described useful for quadrature in U.S. Pat. No. 4,680,548; it consists of a pair of conductive loops disposed in a spaced apart relationship along a common longitudinal axis, with a plurality of conductive elements electrically interconnecting the loop elements at points spaced along the periphery of each loop element, and each of said segments having at least one reactive element in series; furthermore said segments generally being disposed substantially parallel to the longitudinal axis. Such a circuit may be said to be related to a generic class called ladder circuits, and may be said in particular to comprise a re-entrant ladder circuit, since its topology as exemplified in the teachings of U.S. Pat. No. 4,680,548 is substantially that of a flexible ladder structure, closed upon itself.

A re-entrant ladder circuit may be converted into an open ladder circuit by cutting the loop elements in the vicinity of the two ends of one particular interconnecting segment, producing thereby an object with the topology of a simple ladder. Open ladder circuits are well known in the radiofrequency art where they are used as filters, and open ladder resonators were known in the NMR art prior to the introduction of re-entrant ladder resonators.

A particularly useful embodiment of the re-entrant ladder circuit is one in which the rungs of the ladder are strictly parallel to the cylinder axis, and spaced evenly about the azimuth of the cylinder, and comprise $2^M$ in number, (with M an integer $>3$) and have identical electrical reactances associated therewith. It is understood here that terms like "strictly parallel" and "identical reactance" are to be interpreted as meaning what is achievable with normal manufacturing or fabrication practice, and are therefore not absolute. While an idealization of such a resonator could be called a symmetric re-entrant ladder resonator, the realizable embodiment is of more concern to us, and will be referred to in the sequel as the Nominally Symmetric Re-entrant Ladder Resonator, or NSRL resonator. As is known in the radiofrequency art, ladder circuits may be fabricated with different generic filter characteristics, and common types are the low-pass, high-pass, and band-pass. NMR resonators may be built corresponding to each of these types. The first is described in U.S. Pat. No. 4,680,548, the latter two in U.S. Pat. No. 4,680,548. It should be noted that while the usages "low pass" and "high pass" in these patents are in strict conformity with the radiofrequency art, the "band pass" is not, and we shall use these terms as they are understood in the patents, and not as they might be understood by practitioners of the radiofrequency art who are not versed in the NMR art.

SUMMARY OF THE INVENTION

In the present invention, a method of correcting an asymmetry in an NMR radio frequency coil of the type having a pair of conductive loop elements disposed in a spaced apart relationship along a common longitudinal axis is disclosed. Further, the coil has at least eight conductive segments with each segment having at least one reactive element in series therewith. Each of the segments electrically interconnects the loop elements at points spaced along the periphery of each of the loop elements. The segments are disposed substantially parallel to the longitudinal axis. The method of the present invention comprises detecting the asymmetry in the coil. The magnitude and the position of a first reactive element to be placed in series with one of the segments is calculated. The first reactive element is placed in series with the one segment. The asymmetry in the coil is then detected again. The magnitude of a second reactive element to be placed in series with another of the segments is calculated. The second reactive element is placed in series with another segment substantially at 45° spaced apart from the first reactive element.

An NMR radio frequency coil having N-fold symmetry and reduced eddy current is also disclosed.

DETAILED DESCRIPTION OF THE DRAWINGS

Figure 1:
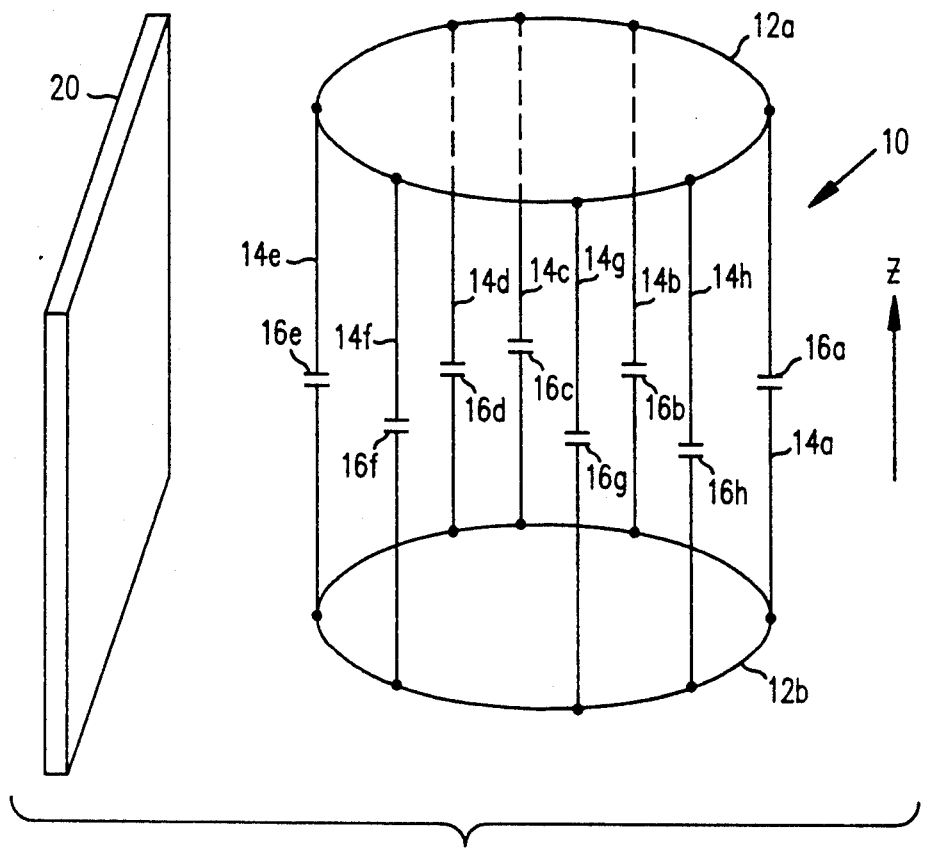
FIG. 1 is a perspective view of the detection and correction of the asymmetry in an NMR coil using the method of the present invention.

Referring to FIG. 1 there is shown an NMR coil 10. The NMR coil 10 has a pair of conductive loop elements 12a and 12b which are generally disposed in a spaced apart relationship along a common longitudinal axis z. A plurality of conductive segments 14(a-h) with each segment having at least one reactive element 16 (a capacitor) in series therewith, electrically interconnect the loop elements 12 at points spaced along the periphery of the loop elements 12. The segments 14 are disposed substantially parallel to the longitudinal axis z. There are at least $2^n$ (where $n \geq 3$) conductive segments 14, positioned generally evenly spaced apart from one another about the periphery of the loop elements 12. Thus, if $n=3$ and there are eight segments, each segment would be spaced $\pi/4$ radians (or 45°) apart from one another around the periphery of the loop elements 62. If $n=4$, there are 16 segments with each segment substantially $\pi/8$ radians (or 22½°) from one another.

Using the method described in J. Tropp, *Journal of Magnetic Resonance*, Vol. 82, pages 51–62 (1989) (hereinafter "Tropp"), the coil 10 is placed adjacent to a coupling coil 20 to measure the frequency and polarization.

The coupling coil 20 is of generally a planar coupling coil, which is inductively coupled to the coil 10. A radio frequency signal is applied to the coupling coil 20. An induced radio frequency signal is generated in the coil 10. The resonance frequency of the induced radio frequency signal is measured. The shift in the frequency of the induced resonance from the generated radio frequency signal is also determined. The splitting is measured in practice by exciting the resonator with a swept frequency source by means of a planar inductive pickup coil (as described in Tropp), and monitoring the dip in measured return loss, as the resonator is rotated (as upon a "lazy Susan" apparatus) with the inductive pickup coil held fixed. It will be observed that the maximum and minimum frequencies at which the dip in return loss occurs will occur at two rotation angles spaced by $\pi/2$. The numerical difference between these maximum and minimum frequencies is the splitting, $\Delta$. The magnitude of a first correcting capacitor is calculated as follows: The parameter $\delta$ (introduced originally in Eq. [15] of Tropp, and generalized in Eq. [1-4] of the theory section as set forth hereinafter), is defined in relation to $\Delta$ by the equation $\delta = N\Delta/\omega_0$, where $\omega_0$ is the average frequency of the two useful modes, and N is the number of rungs in the ladder resonator. Then the magnitude of a correction capacitor C', to be placed in parallel with the existing capacitor on the resonator is:

$$C' = C_0[\delta/(1 - \delta)]/4,$$

where $C_o$ is the nominal value of the capacitance at the site on the NSRL resonator to which correction will be applied. That site is determined as follows: Choose the axial conductive segment bearing largest current in the high frequency mode, as ascertained by sensitivity of return loss to finger touch. The first corrective reactive element $C_1$ is placed in series with one of the conductive segments 14.

Thereafter, the coil 10 with the first corrective reactive element $C_1$ is placed adjacent to the coupling coil 20 and the asymmetry in the coil 10 is detected again. The magnitude of a second corrective reactive element $C_2$ to be placed in series with another one of the segments 14 is then calculated. The second corrective reactive element $C_2$ is placed in series with the other conductive segment 14 substantially 45° spaced apart from the first reactive element. The reactive element $C_1$ and $C_2$ are substantially capacitive elements.

Alternatively, the magnitude of the two reactive elements to be electrically connected at substantially forty-five degrees (45°) apart can be calculated by the following equation:

$$\Delta = \omega_0 (\delta^2_n + \delta^2_{(n+N/8)})^{\frac{1}{2}}$$

where as discussed previously,
$\Delta$ is the numerical difference between the maximum and minimum frequencies
$\omega_0$ is the average frequency of the two useful modes
N is the total number of rungs in the ladder,
n is the $n^{th}$ rung in the ladder
$\delta_n = C_n/(C_0+C_n)$
$C_n$ is the correction capacitor at the $n^{th}$ rung in the ladder
$C_0$ is the nominal capacitance without the correction capacitor.

The theory of the method of the present invention is as follows:

First we show that any perturbation of capacitors on a low pass bird cage is equivalent to perturbation of two capacitors spaced at an azimuth of $\pi/4$; next we derive the equation for a perturbed inductor, and show that this is equivalent to perturbation of two suitably located capacitors; finally we deduce that any combination of inductive and capacitive perturbations can be synthesized by a purely capacitive perturbation, and thereby effectively reduced to a pair of capacitors. This last result is then shown to hold for any type of nominally symmetric bird cage structure, high-pass: low-pass, or band-pass.

Perturbation theory on the manifold of 'NMR useful' states reduces to finding the eigenvalues and eigenvectors of a $2 \times 2$ Hermitian matrix, denoted H. For perturbation of several sites on the coil, H is the sum of matrices H(n), each arising from an individual perturbation acting at the nth site alone. The matrices H(n) have well defined transformation properties under rotations about the cylinder axis, and some choice of phase convention is required to insure correct matrix addition for perturbations at different sites. For a single capacitor in a low-pass bird cage of N meshes the simplest form of H arises if we number the legs of the coil consecutively from 1 to N, and choose the perturbed capacitor as the Nth (or equivalently, zeroth). The resulting H is given in Eq. [20] in Tropp (in which the author, regrettably, failed to specify which capacitor is perturbed.) We define the azimuth by assigning to the nth capacitor the value $2\pi n/N$, which is equivalent to an azimuth of zero for Nth.

We now give the equations for a bird cage perturbed in all N legs. The strength of the perturbation in the ith leg is measured by the parameter $\delta_i$, as in Tropp. Since perturbations spaced by an azimuth of $\pi$ will (in first order) add perfectly in phase, we need only consider N/2 of the $\delta$'s, and it is to be understood in the sequel that $\delta_i$ is actually the sum of $\delta_i + \delta_{i+N/2}$. Then, using Eq. [28] of (2), and adding the perturbations of different legs, the elements of the complete perturbation matrix are obtained:

$$H_{11}/\omega_1^2 = 1 - \left(\sum_{n=0}^{N/2-1} \delta_n\right)/N = H_{22}/\omega_1^2 \quad [1]$$

$$H_{12}/\omega_1^2 = \sum_{n=0}^{N/2-1} \epsilon^{-(2n+1)}\delta_n/N = H_{21}^*/\omega_1^2, \quad [2]$$

where $\epsilon = \exp(2\pi i/N)$, $\omega_1$ is the unperturbed mode frequency, the star denotes complex conjugation i and $\sqrt{-1}$. (The sum [1] runs from zero to N/2, to avoid placing the Nth element out of sequence.) For definiteness, we also give the results for $N=16$.

$$H_{11}/\omega_1^2 = 1 - \left(\sum_{n=0}^{7} \delta_n\right)/N = H_{22}/\omega_1^2 \quad [3]$$

$$H_{12}/\omega_1^2 = \epsilon^{-1}\{\delta_0 - \delta_4 + 2^{-\frac{1}{2}}(\delta_1 + \delta_7 - \delta_3 - \delta_5) - \quad [4]$$

$$i[\delta_2 - \delta_6 + 2^{-\frac{1}{2}}(\delta_1 + \delta_3 - \delta_5 - \delta_7)]\}/16 = H_{21}^*/\omega_1^2.$$

Denote, as in (2) the unperturbed useful eigenvectors as $|1\rangle$ and $|N-1\rangle$. The perturbed eigenvectors for the useful states are then:

$$|P_1\rangle = (|1\rangle - \xi|N - 1\rangle)/\sqrt{2} \quad [5]$$

$$|P_2\rangle = (|1\rangle - \xi|N - 1\rangle)/\sqrt{2}, \quad [6]$$

where $\xi = H_{21}/|H_{21}|$. The corresponding eigenvalues are $$E_1 = \omega_1^2(H_{11} - |H_{21}|), \quad [7]$$

$$E_2 = \omega_1^2(H_{11} + |H_{21}|). \quad [8]$$

The currents in the nth mesh for the two eigenstates are $$I_n = (\epsilon^n \pm \xi\epsilon^{-n})/\sqrt{(2N)}, \quad [9]$$

where the − sign pertains to $|P_1\rangle$ and the + sign to $|P_2\rangle$. Defining the angle $\phi$ by $\exp(i\phi)=\epsilon^{-1}\xi$, we calculate the leg currents:

$$i_n = I_n - I_{n+1} = \sqrt{(2/N)}\exp(I\omega/2)(1-\epsilon)\cos[2\pi n/N] - \phi/2], \text{ (for } |P_1\rangle) \quad [10]$$

$$i_n = I_n - I_{n+1} = \sqrt{(2/N)}\exp(I(\phi+\pi)/2)(1-\epsilon)\sin[2\pi n/N] - \phi/2], \text{ (for } |P_2\rangle) \quad [11]$$

The matrix element $H_{12}$ has the general form $\epsilon^{-1}(x-iy)$, where x and y can be regarded as independent real variables; this form remains unchanged if all $\delta$'s save $\delta_0$ and $\delta_{N/8}$ are set equal to zero. But this would correspond to perturbation of only two legs spaced by an azimuth of $\pi/4$. Therefore as regards the off diagonal matrix elements, perturbing all 16 legs is mathematically equivalent to perturbing just two legs spaced $\pi/4$, provided that suitable values of capacitance (measured by x and y) are chosen. The phase shift $\phi/2$ ($\phi=\arctan(y/x)$) in the current distributions of Eq. [10] and [11] describes a rotation of the polarization axes of the perturbed modes. In a coil singly perturbed at azimuth zero, one diametral axis passes through zero; the other through $\pi/2$. In the coil doubly perturbed at 0 and $\pi/4$, the two axes undergo a concerted rotation of $\phi/2$.

As discussed earlier in Tropp the characteristic symptoms of broken symmetry (split eigenvalues and polarized modes) arise purely from the off-diagonal elements of H, and symmetry correction may be effected if these can be set to zero. For the simple case of a single perturbation, this is accomplished by introducing an identical perturbation at an azimuth $\pi/2$ distant. This abolishes the broken symmetry (in first order) while introducing an unimportant level shift in the eigenvalues. Symmetry correction for an arbitrarily perturbed coil is also possible, using the theory given above. In principle, at least, the procedure goes in the following steps. First, determine the sizes and locations of two capacitors which produce the same off-diagonal terms as the net sum of the existing perturbations. That this will always be possible, and that the requisite capacitors will be spaced by an azimuth of $\pi/4$, has been shown above. Second, apply these two capacitors not at the positions which would mimic the existing perturbation, but with the configuration rotated by an azimuth of $\pi/2$. Given the known transformation properties of H, this will cause the two new capacitors to subtract away the off diagonal elements of H, thus restoring symmetry, again, at the cost of a small level shift.

To recap: we have shown that the splitting and polarization directions of a low pass bird cage of $2^N$ legs ($N \geq 3$), arbitrarily perturbed with capacitors at every leg, can be mimicked by the splitting and polarization of similar bird cage, initially perfect, to which two suitable capacitors have been added, spaced apart by an azimuth of $\pi/4$. Since the off diagonal matrix elements of perturbations placed $\pi/2$ apart on the coil will subtract, two suitable additions or subtractions of capacitance $\pi/4$ apart from each other can always be made to cause the vanishing of the off-diagonal terms of H, and thus correct the symmetry. The oractical procedure for so doing will be described later.

We now consider a low-pass bird cage with a perturbed inductor. Our goal is to show that the off-diagonal terms of the resulting H can also be produced by suitable alteration of two capacitors. Before giving an explicit calculation, we sketch a rather general argument which shows this. For a loss less resonator (the only type we consider) the eigenvalues of the Kirchoff equations must be real; so the perturbation matrix must be Hermitian and may thus be expanded in a linear combination of Pauli matrices ($\sigma_x, \sigma_y,$ and $\sigma_z$) plus the identity. Therefore, the off-diagonal terms must be represented by a linear combination of $\sigma_x$ and $\sigma_y$. Since a perfect bird cage perturbed by two capacitors spaced by $\pi/4$ has complex off-diagonal terms, and since the real and imaginary components are individually variable, it must be possible to synthesize the effect of inductive perturbation by two capacitors.

We now work out the derivation in more detail. Using our earlier notation and mesh-numbering conventions of (2), and ignoring any mutual inductance between meshes, we obtain, for a low pass bird cage of N legs with the nth inductance perturbed, the mesh equation:

$$[s^2 + 2\omega_a^2(2-\delta')]I_n - \omega_a^2(1-\delta')[I_{n+1}+I_{n-1}] = 0 \quad [12]$$

where we assume the perturbed inductance, $L_n'$ is related to the total unperturbed mesh inductance ($L_n = L_n^{(1)} + L_n^{(2)}$) in FIG. 1 of Ref. (2) by $L_n' = L_n/(1-\delta')$. The elements of H for perturbation of the Nth inductance of are obtained by unitary transformation of the entire system of mesh equations:

$$H_{11}/\omega_1^2 = (1-\delta')/N = H_{22}/\omega_1^2, \quad [13]$$

$$H_{12}/\omega_1^2 = -\delta'/N = H_{21}/\omega_1^2, \quad [14]$$

The eigenvectors are:

$$|P_1\rangle = (|1\rangle - |N-1\rangle)/\sqrt{2}, \quad [15]$$

$$|P_2\rangle = (|1\rangle + |N-1\rangle)/\sqrt{2}. \quad [16]$$

The corresponding eigenvalues are:

$$E_1 = \omega_1^2, \quad [17]$$

$$E_2 = \omega_1^2(1 - 2\delta'/N).$$

The nth mesh current is $$I_n = (\epsilon^n \pm \epsilon^{-n})/\sqrt{(2N)}, \quad [18]$$

where the positive sign is for $|P_2\rangle$ and the negative for $|P_1\rangle$. Aside from a multiplicative constant, this current distribution is phase shifted by an angle of $\pi/N$ from the current distribution resulting from perturbation of the Nth capacitor.

Of most interest is the fact that the off-diagonal matrix elements are purely real. Now consider the case of equal capacitive perturbations applied to the two shut legs adjacent to the Nth inductor (the Nth and N−1st in our numbering convention.) The resulting matrix elements of the two perturbations are:

$$H_{12}(N)/\omega_1^2 = \epsilon^{-1}\delta/N, \quad [19]$$

$$H_{12}(n-1)/\omega_1^2 = \epsilon^{-\{2(n-1)+1\}\delta} = \epsilon\delta/N. \quad [20]$$

Since these are complex conjugates, their sum is real. Therefore by suitable selection of the value of $\delta$, this pair of perturbations can be made to mimic the symmetry breaking effect of the inductive perturbation. The effect of several inductive perturbations can then be treated along lines similar to those given earlier for several capacitive perturbations.

It should now be clear that any collection of perturbations of the reactances of a low pass bird cage can be synthesized, and therefore corrected, in first order, by a pair of capacitors spaced at an a azimuth of $\pi/4$. To extend this result to the high-pass and band-pass bird cage, we suggest the following. We restrict consideration to simple ladder topologies, in which each rung, or end ring section comprises only series-connected reactances; this allows the simple band-pass configuration (see U.S. Pat. No. 4,680,548) but excludes bird cages designed for dual frequency operation. See A. Rath, *J. Magn. Reson.* v. 86, p. 488 (1990). Any nominally symmetric re-entrant ladder structure will have eigenfuctions spanned by the travelling-wave functions given in Tropp, and the perturbed Hamiltonian over the manifold of the two useful states will be $2 \times 2$ Hermitian. Therefore the rotational properties of the perturbation will as described in Tropp; and a pair of perturbations spaced by $\pi/4$ on the azimuth will span all possible off diagonal terms for the H describing an arbitrary perturbation. Therefore, in particular, a pair of capacitors will provide the perfect symmetry correction in first order. Sometimes only one capacitor will be needed, as in as the case of a low pass bird cage those polarization planes align exactly with of pairs of legs; this corresponds to a phase shift $\phi/2$ in Eq. [10] of exactly $n2\pi/N$, where n is any integer. When $\phi/2$ has some intermediate value, it is no longer possible to place a trimming capacitor exactly along the polarization axis; and two capacitors (added to legs) will be required. It is, however, worth noting that a single inductive trimmer, consisting of a conductive loop held proximal to the resonator, can always be aligned to provide reactance precisely along the polarization axis. It is therefore possible in principle, if not in practice, to perform symmetry correction with a single reactive element.

The last theoretical question which requires attention is relation between broken symmetry and cross-talk in lab-frame quadrature reception. We have mentioned that the split states of a perturbed bird cage are analogous to those of a pair of identical LC resonators coupled together by a parasitic mutual impedance; and that a normalized coefficient of coupling $\eta$ describes both cases. This analogy must be qualified as we now describe.

The eigenfrequencies of the coupled resonator pair cannot be tuned into coincidence by any manipulation of the tank capacitors; but this is not true of the bird cage. In fact, if it were possible (as it often is not) to apply tuning capacitance exactly along natural polarization axis of a bird cage, then one could, by that adjustment, tune the resonances to coincidence, and they would behave as uncoupled oscillators (i.e., the resonances would tune through each other rather than repel.) On the other hand, if the tuning capacitance were applied, say, at exactly $\pi/4$ distant from the polarization axis, not only would coincidence not be achieved, but no reduction in splitting would be possible. At intermediate positions, greater or less reduction of the splitting would be obtained, depending upon the angle between the polarization axis and the point at which tuning reactance is applied. Calling that angle $\theta$, the normalized splitting can in fact be trimmed to a minimum of $\xi\sin2\theta$ and no further. This angular dependence suggests that the measured cross-identical talk between channels of a perturbed bird cage as well should depend upon the angle between the natural polarization axes, and the axes along which actual signal reception is performed. This is indeed the case, as we will show.

We consider the unadorned bird cage resonator as the system to be studied, and the network of inductors or capacitors which couple the resonator to the outside world as the detector. The system is characterized by a pair of eigenstates, while the detector defines a pair of orthonormal basis states. Measurement consists in determining the eigenfrequencies of the system, and the projections of its eigenstates on the detector basis states. In quadrature reception, the detection circuit comprises two coupling networks oriented $\pi/2$ apart on the resonator azimuth: (Therefore, in first order the detector does not perturb the system.) The detector states are linear combinations of the unperturbed system eigenstates, and correspond to excitations of orthogonal linearly polarized B fields. The orientation of the coupling network defines a pair of orthogonal axes (the detection axes) which may be rotated at the experimenter's pleasure about the azimuth. Each orientation defines a different basis set.

We now distinguish the symmetric (unperturbed) resonator from the polarized (perturbed) resonator. In the symmetric case, measurements at different orientations of the detector will be indistinguishable one from the other. Any cognate pair of the detector states will be admissible (though not unique) eigenstates of the system, as will the travelling wave states. However, in the asymmetric case, the polarized resonator itself also distinguishes a set of axes in space (the resonator axes), and the measured projections on the detector states obtained will vary as the sine and cosine of the angle(denoted $\phi$ as above) between detection and resonator axes. In the special case when the two axis systems coincide, the detector states will be admissible eigenstates, and the split eigenfrequencies will be tunable into degeneracy by a tuning reactance applied along one of the detector axes.

On the other hand, if the polarization and detection axes do not coincide, the only admissible eigenstates will be linear combinations of the detector states. The eigenstates will show the behavior of a pair of coupled oscillators, and will not be tunable into degeneracy by application of tuning reactance along the detector axes. If we stipulate that tuning reactance can be applied only along the detection axes, as is typical for practical coils, we may introduce the artifice of an angle-dependent coefficient of coupling, $\eta(\phi) = \eta\sin2\phi$, which gives the minimum splitting attainable for a given $\phi$. The corresponding best results achievable for cross-talk and signal to noise decrement are $-20 \log\eta(\phi)$ and $-10 \log[1+\eta(\phi)^2]$. This corresponds to zero cross talk and signal loss at $\phi = 0$, and maximum cross-talk and signal loss at $\phi = \sigma/4$.

The above considerations demonstrate that if and $\xi$ and Q are known, then cross talk between quadrature channels may be with confidence stated to be below $-20 \log\eta$, regardless of the relative orientations of the polarization and detection axes. Since measurement of $\xi$ and Q is easier than adjustment of $\phi$, and since $\xi$ is easily corrected it is then straightforward to fabricate a bird cage which is guaranteed to meet a given performance specification for cross-talk.

VERIFICATION OF THE THEORY AND PRACTICAL CORRECTION METHODS

The experiments we will describe were done on a low pass bird cage of 16 legs, fabricated with copper tape and porcelain chip capacitors (American Technical Ceramics) on a plexiglass cylinder. The window height was 10.8 in. and the outer diameter (copper to copper) was 10.5 in.; the leg width was 0.5 in. and the nominal leg capacitance was 136 pF (2×68). Resonance frequencies were measured from the dip in reflection coefficient with weak inductive coupling (return loss <3dB) using an HP 8753 network analyzer; the resonator was mounted on a wooden table about 5 feet from the analyzer, and two orthogonal coupling loops were fixed to the table and attached to the $S_{11}$ and $S_{22}$ ports of the analyzer. The frequencies are believed to accurate to within ±3 kHz. Polarization directions were determined by noting the orientation of the coupling loops with respect to the resonator as described elsewhere(2); the errors are believed to lie within one half of the aperture subtended by a window, i.e ±5°. In most cases it was necessary to assess the sensitivity of return loss to finger touch at several legs, to ascertain which leg (or legs) were most (or least) sensitive.

The coil as built had frequencies of 15.155 MHz and 15.137 MHz for its useful modes, corresponding to a splitting of 18 kHz and a normalized splitting ($\xi$) of 0.0012. The legs were numbered consecutively, and all subsequent addition and subtractions of capacitors were tabulated. A single 2.1 pF capacitor was applied to the 12th leg, which reduced the splitting to 6 kHz; the resulting state of the bird cage was the reference state, and was periodically verified throughout the course of experimentation.

It is a straightforward matter to apply several capacitors to an already symmetric bird cage, and to then calculate from theory the resultant splitting and polarization of the useful modes. This calculation yields directly the requisite values of the two correction capacitors, which may then be applied, and the efficacy of correction measured. Such experiments constitute a means of verifying the theory, and of scouting the limits of the first order approximation. Table 1 shows the results of two runs, one within the first order limit, and one beyond it. Each run was begun with the bird cage in the reference state described above. Four perturbing capacitors were then added, and the expected splitting and polarization angle $\phi/2$ were calculated and compared to the measured values. Values for two correction capacitors were calculated from Eq. [4] by assuming that the entire perturbation was concentrated in the zeroth and second legs. As described earlier, these calculated capacitor were applied not to legs 0 and 2 but to 4 and 6 (a shift in azimuth of the $\pi/2$) to give the nominally corrected resonator.

As can be seen from the entries 1a and 1b of Table 1, this first order procedure is quite successful with an initial splitting $\xi=0.0035$. The value of $\eta$ for the corrected coil, assuming a Q of 150 (due to sample loading) is 0.02, corresponding to cross talk of $-34$ dB and signal to noise loss of about 0.002 dB, which is negligible. Repeated trials suggest that similar corrections may be routinely obtained for initial $\xi \leq 0.004$. However, examination of entries 2a and 2b of the table shows the first order correction beginning to break down with a starting $\xi$ of 0.007. The calculated correction leaves a residual splitting of 19 kHz, which gives $\eta=0.19$, with cross talk and signal to noise loss of $-14.4$ dB and 0.15 dB. Since this represents 5 to 10% of the system noise figure in a modern spectrometer or NMR imager, some effort towards its reduction is warranted.

Further correction was accomplished empirically by successive approximation as follows. Assuming that the entire residual splitting (19 kHz) arose from a single capacitor a correction capacitance of 2.8 pF was calculated. The measured polarization angle was 5°, corresponding approximately to anti-nodes of the low frequency mode at legs 0 and 8, and of the high frequency mode at 4 and 12. An effective 2.5 pF was added to leg 4 by replacing a 7.5 pF with a 10.0. The resulting change in splitting was small ($\approx 3$ kHz), but the polarization plane rotated considerably, to $-45°$. The anti-nodes of the high-frequency mode were now located at legs 2 and 10; and application 2.1 pF to leg 2 reduced the splitting to <3 kHz, which was judged acceptable. The procedure has been described in detail for illustrative purposes. The failure of the first order correction was presumed due to second order effects. It was thought that the first order subtraction of correction capacitors on legs 2 and 6 might actually lead in principle to a correction involving just two legs spaced by $\pi/4$, as predicted by theory, but attempts to verify this expectation met with failure. Other experiments suggest that some second order perturbations may be cured with two capacitors spaced at an arbitrary angle not a multiple of $\pi/2$; e.g.$3\pi/8$.

The above considerations lead us to a general procedure for attempting symmetry correction for the real world case in which the only information available concerning the perturbation is the splitting and polarization angle. In the first order regime ($\xi < 0.004$) the following steps usually work. From the measured splitting, calculate a correcting capacitor (the primary correction) assuming all splitting due to that capacitor alone, and apply it to leg nearest the current anti-node of the high frequency mode (i.e. as near $(\phi+\pi)/2$ as possible.) Remeasure the splitting and polarization and determine the value of a second capacitor (if needed) corresponding to the new splitting. Almost invariably, the anti-node of the new high-frequency mode will shifted $\pm\pi/4$ from the original, so that the two correct the capacitors will be $\pi/4$ apart. While it is true in principle that both values of the correcting capacitors could be calculated from measured values of $\xi$ and $\phi/2$, in practice it is difficult to obtain sufficiently accurate values of $\phi/2$ and the simple approximation given above is easier and faster.

Symmetry correction in the second order regime ($0.005 < \xi < 0.01$) is similar to the first order, but less straightforward; and at best only guidelines can be given. A good starting point is to follow the first order procedure, but with these caveats. 1) The primary correction capacitor calculated from the initial splitting will probably be too large, and its value should be refined empirically by seeking the minimum splitting. 2) The secondary capacitor may or may not require application $\pi/4$ distant from the primary. It should always be placed as near as possible to the current anti-node of the high frequency mode. 3) A third capacitor (or subtraction of capacitance) may be required on the primary leg and a fourth capacitor may as well be required elsewhere. To illustrate these points, we prepared the resonator in the perturbed state corresponding to Case 2a of Table 1, and corrected it empirically as just described. Capacitors were applied in the lo following order: 15 pF to leg 6; 5 pF to leg 4; 2.1 pF to leg 6 again; at which point the splitting had been reduced from 1 15 kHz to 9 kHz. Further correction (not performed) would have required application of 1.3 pF to leg 1.

We have not attempted to correct resonators with splittings much larger than $\xi = 0.008$, and it is our experience that when the splittings exceed $\xi = 0.015$ there is usually some discoverable flaw in construction (e.g. a wrong capacitor). We have not attempted calculations in the second order case.

TABLE 1
Summary of Perturbations Applied to Resonator, and Subsequent Corrections, With Resulting Splittings and Polarizations[a]

Case 1a: Perturbation in First Order Regime:

| $\delta_0$ | $\delta_1$ | $\delta_2$ | $\delta_3$ | $\omega_0\xi$ (kHz) | $\phi/2$ (deg.) |
|---|---|---|---|---|---|
| 0.014 | 0.014 | 0.035 | 0.014 | 53 (calc.) | 38 (calc.) |
| (2.1 pF) | (2.1 pF) | (5.1 pF) | (2.1 pF) | 56 (meas.) | 40 ± 5 (meas.) |

Case 1b: Symmetry Correction in First Order Regime:[b]

| $\delta_4$ | $\delta_6$ | | | $\omega_0\xi$ (kHz) | $\phi/2$ (deg.) |
|---|---|---|---|---|---|
| 0.014 | 0.0547 | | | <2 | — |
| (2.1 pF) | (7.8≈7.5 pF)[c] | | | | |

Case 2a: Perturbation in Second Order Regime:

| $\delta_0$ | $\delta_1$ | $\delta_2$ | $\delta_3$ | $\omega_0\xi$ (kHz) | $\phi/2$ (deg.) |
|---|---|---|---|---|---|
| 0.014 | 0.014 | 0.035 | 0.068 | 104 (calc.) | 30 (calc.) |
| (2.1 pF) | (5.1 pF) | (5.1 pF) | (10 pF) | 111 (meas.) | 30 ± 5 (meas.) |

Case 2b: Symmetry Correction in Second Order Regime:[d]

| $\delta_4$ | $\delta_6$ | $\delta_2$ | $\omega_0\xi$ (kHz) | $\phi/2$ (deg.) |
|---|---|---|---|---|
| 0.0559 | 0.0965 | | 19 | 0 ± 5 |
| (7.5 pF) | (14.5≈15 pF)[c] | | | |
| ******* | | | | |
| 0.020 | | | 16 | −45 ± 5 |
| (2.8≈2.5 pF)[c] | | | | |
| | | 0.017 | <3 | — |
| | | (2.3≈2.5 pF)[c] | | |

[a]Values of the perturbation parameter δ (with the corresponding capacitance always written just below) are given both for perturbations and corrections. For perturbations, δs were calculated from capacitances chosen ad lib; conversely, for corrections, capacitances were calculated from the measures δs. All tabulated values of $\omega_0\xi$ and $\phi/2$ are measured, unless otherwise noted; and capacitance entries are tabulated on the same horizontal level as the r esultant frequency shifts and polarizations.
[b]The corrections in this case were determined theoretically, by calculation from the known perturbation.
[c]The first capacitance value is that called for in the calculation; the second is that which was available; the approximation sign indicates that the latter was used in practice for the former.
[d]The entries above asterisks represent the first order correction calculated from prior knowledge of the perturbation; those below were applied empirically according to procedures described in the text.

Thus, as can be seen, from the foregoing equations., the asymmetry in an NMR radio frequency coil of the type having a pair of conductive loop elements interconnected by at least eight conductive segments can be reduced to a problem of placing a pair of corrective reactive elements spaced 45° apart from one another.

Figure 2:
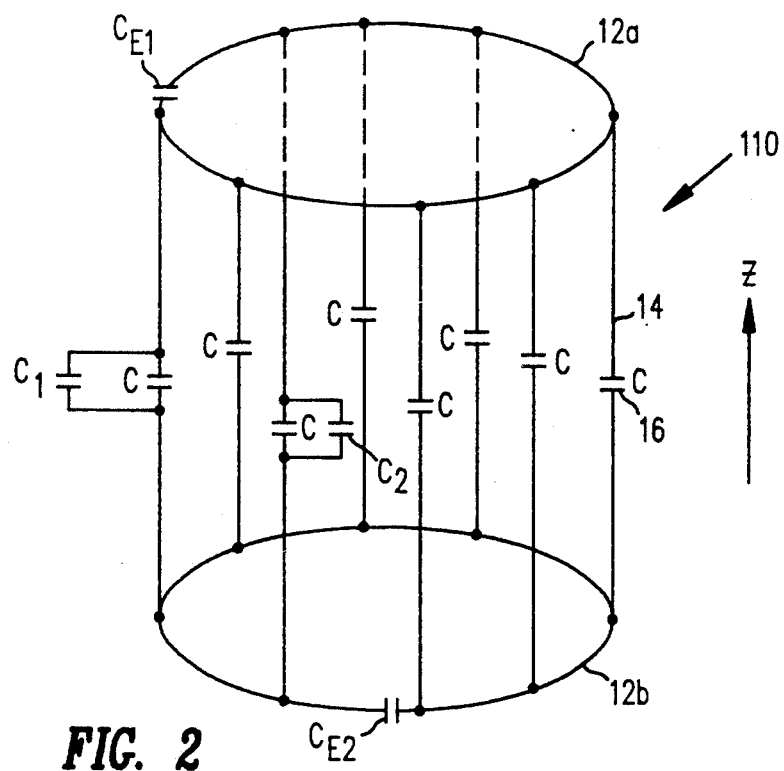
FIG. 2 is a perspective schematic view of an improved NMR radio frequency coil having N-fold symmetry and reduced eddy current in accordance with the present invention.

Referring to FIG. 2, there is shown an NMR coil 110 having N-fold symmetry and reduced eddy current, in accordance with the present invention. The NMR coil 110 has a pair of conductive loop elements 12a and 12b, which are generally disposed in a spaced apart relationship along a common longitudinal axis z. Within each of the loop elements 12a and 12b, however, is a capacitive element $C_{E1}$ and $C_{E2}$. Each of the capacitive elements $C_{E1}$ and $C_{E2}$ is placed in a loop element and is connected in series therewith in order to reduce eddy current, as is well known. The capacitive, element $C_{E1}$ and $C_{E2}$, in one preferred embodiment, are positioned substantially 90° apart.

Similar to the coil 10, a plurality of conductive segments 14(a–h), with each segment having at least one reactive element 16 (a capacitor) in series therewith, electrically interconnect the loop elements 12 at point spaced along the periphery of the loop elements 12. The segments 14 are disposed substantially parallel to the longitudinal axis z. Again, there are at least $2^n$ (where $n \geq 3$) conductive segments 14, positioned generally evenly spaced apart from one another about the periphery of the loop elements 12. Thus, if n=3 and there are eight segments; each segment would be spaced $\pi/4$ radians (or 45°) apart from one another around the periphery of the loop elements 12. If n=4, there are 16 segments with each segment substantially $\pi/8$ radians (or 22½) from one another.

Thus far, the NMR coil 110 is similar to the NMR coil 10, except with the addition of the capacitive element $C_{E1}$ and $C_{E2}$ to reduce eddy current. The introduction of capacitive elements $C_{E1}$ and $C_{E2}$, however, breaks the symmetry in the NMR coil 110. This causes NMR coil 110 to have non-N-fold symmetry. However, using the method described heretofore, the NMR coil 110 can be brought back to have N-fold symmetry. In particular, using the method described heretofore, the first and second corrective reactive elements $C_1$ and $C_2$ are measured and positioned substantially $\pi/4$ radians from one another and are placed in series with one of the segments 14 and in parallel with the existing capacitor C in the segment 14. With the addition of the corrective capacitive elements $C_1$ and $C_2$, the NMR coil 110 is then rendered to have N-fold symmetry in addition to having reduced eddy current. Thus, with the method of the present invention, an improved radio frequency coil having N-invention, fold symmetry and reduced eddy current is produced.

What is claimed is:

1. A method of correcting an asymmetry in an NMR radio-frequency coil of the type having a pair of conductive loop elements disposed in a spaced apart relation along a common longitudinal axis, with at least $2^n$ ($n \geq 3$) conductive segments each having at least one reactive element in series therewith, said segments electrically interconnecting said loop elements at points spaced along the periphery of each of said loops, said segments being disposed substantially parallel to said longitudinal axis, wherein said method comprising:

detecting said asymmetry in said coil;

calculating the magnitude and position of a first reactive element to be placed in series with a first segment;

placing said first reactive element in series with said first segment;

detecting said asymmetry in said coil;

calculating the magnitude of a second reactive element in series with a second segment; and placing said second reactive element in series with said second segment, said second segment and said first segment are spaced apart substantially 45° from one another.

2. The method of claim 1 wherein said first and second reactive elements are capacitance elements.

3. The method of claim 1 wherein said detecting step further comprising:

exciting said coil with a resonant frequency; and measuring the shift in the resonant frequency generated by said coil.

4. The method of claim 3 wherein said exciting step further comprises:

inductively coupling said coil with a resonant frequency to excite it.

5. A method of rendering a NMR radio-frequency coil to have $2^n$ fold symmetry wherein said coil is an NMR radio-frequency coil of the type having a pair of conductive loop elements disposed in a spaced apart relation along a common longitudinal axis, with at least $2^n$ ($n \geq 3$) conductive segments each having at least one reactive element in series therewith, said segments electrically interconnecting said loop elements at points spaced along the periphery of each of said loops, said segments being disposed substantially parallel to said longitudinal axis, wherein said method comprising:

calculating the magnitude of two reactive elements each element electrically connected in series with a different conductive segment of said coil, said segments are positioned substantially forty-five degrees (45°) apart, said elements substantially satisfying the equation of:

$$\Delta = \omega_0 (\delta^2_n + \delta^2_{(n+N/8)})^{\frac{1}{2}}$$

where:

$\Delta$—is the numerical difference between the maximum and minimum frequencies of the induced resonance from the generated radio frequency signal;

$\omega_0$—average frequency of the two useful modes, i.e. nodal and anti-nodal;

$\delta_n = C_n/C_0 + C_n$;

$C_0$ is the nominal capacitance;

$C_n$ is the correction capacitance to be added;

N is the total number of rungs in the ladder resonator;

positioning said reactive elements in said conductive segments, which are substantially forty-five degrees (45°) apart.

6. An improved NMR radio-frequency coil having n-fold symmetry and reduced eddy current, said coil comprising:

a first conductive loop element having a first capacitive element in series therewith;

a second conductive loop element having a second capacitive element in series therewith;

said first and second loop elements are disposed in a spaced apart relation along a common longitudinal axis;

a plurality of conductive segments ($2^n$, where $n \geq 3$), positioned substantially parallel to said longitudinal axis and substantially symmetrically about the periphery of the first and second loop elements interconnecting said loop elements; and a substantially similar capacitive element in each of said conductive segment in series therewith; and corrective capacitive means in said conductive segments, with said conductive segments positioned substantially forty-five degrees (45°) apart to render said coil to have n-fold symmetry.

7. The coil of claim 6 wherein said first and second capacitive elements are positioned substantially ninety degrees (90°) apart.

8. A method for correcting the asymmetry of a Nominally Symmetric Re-entrant Ladder resonator (NSRL resonator) having $2^N$ rungs (N an integer >3), with a capacitor in each of said rungs, comprising the steps of:

measuring the resonant frequencies of the normal modes of said resonator each of said normal modes having a nodal plane and an anti-nodal plane;

determining the orientations of the nodal and anti-nodal planes associated with each of said normal modes;

calculating the value of a first correcting reactive element as a function of the difference between the resonant frequencies of said two normal modes;

electrically connecting said calculated reactive elements in parallel with a capacitor in one of said rungs;

repeating the steps of measuring the resonant frequencies and determining the orientations of nodal and anti-nodal planes for modes with the addition of said first reactive element;

calculating the differences in resonant frequencies of the modes with the addition of said first reactive element to determine whether a second reactive element is required; and electrically connecting said second calculated reactive element in parallel with a capacitor in another one of said rungs only in the event the second reactive element is required.

* * * * *